(12) United States Patent
Mourant

(10) Patent No.: US 6,687,494 B1
(45) Date of Patent: Feb. 3, 2004

(54) LOW POWER RADIO TELEPHONE IMAGE REJECT MIXER

(75) Inventor: Jean-Marc Mourant, Groton, MA (US)

(73) Assignee: International Business Machines Corporation, Armonk, NY (US)

( * ) Notice: Subject to any disclaimer, the term of this patent is extended or adjusted under 35 U.S.C. 154(b) by 528 days.

(21) Appl. No.: 09/607,947

(22) Filed: Jun. 30, 2000

(51) Int. Cl.$^7$ .................................... H04B 1/26
(52) U.S. Cl. ................ 455/326; 455/302; 455/327; 455/333; 455/323; 327/359; 327/361
(58) Field of Search ................ 455/326, 302, 455/333, 311, 307, 332, 324, 319, 323, 327; 327/355, 356, 359, 357, 361

(56) References Cited

U.S. PATENT DOCUMENTS

| | | |
|---|---|---|
| 3,805,163 A | 4/1974 | Hata et al. |
| 4,584,715 A | 4/1986 | Baars et al. |
| 5,033,110 A | 7/1991 | Harman |
| 5,140,198 A | 8/1992 | Atherly et al. |
| 5,794,131 A | 8/1998 | Cairns |
| 5,870,670 A | 2/1999 | Ripley et al. |
| 5,950,119 A | 9/1999 | McGeehan et al. |
| 5,973,576 A * | 10/1999 | Ariie .......................... 332/168 |
| 6,029,059 A * | 2/2000 | Bojer .......................... 455/36 |
| 6,226,509 B1 * | 5/2001 | Mole et al. ................. 455/302 |
| 6,308,058 B1 * | 10/2001 | Souetinov et al. .......... 455/326 |
| 6,313,688 B1 * | 11/2001 | Lee et al. .................... 327/359 |
| 6,343,211 B1 * | 1/2002 | Thodesen et al. ........... 455/317 |

* cited by examiner

Primary Examiner—P. Tran
(74) Attorney, Agent, or Firm—Connolly Bove Lodge & Hutz LLP

(57) ABSTRACT

An image reject mixer for a low power battery operated radio telephone application. First and second doubly balance mixer circuits are connected to receive a differential radio frequency signal. Each of the doubly balance mixer circuits receives a local oscillator signal and a complimentary quadrature local oscillator signal. A first and second differential current produced by the first and second doubly balance mixture are combined in a quadrature combining circuit. The quadrature combining circuit adds an additional 90° of phase shift between the pairs of signals produced by each doubly balance mixture, so that the mixture output signals are added in a phase quadrature relationship thereby canceling unwanted spur and image components contained in the respective mixer output circuits.

10 Claims, 2 Drawing Sheets

LOW POWER RADIO TELEPHONE IMAGE REJECT MIXER

BACKGROUND OF THE INVENTION

The present invention relates to the radio telephone art. Specifically, an image reject mixer is provided which draws a minimum of current to preserve the battery life for the radio telephone.

Image rejection mixers solve a common problem of interfering signals experienced by cellular radio telephone receivers. Using a hetrodyne conversion system, the conversion of the input radio frequency signal to an intermediate frequency signal may simultaneously produce undesirable mixing products called spurs which interferes with the conversion of the signal of interest. The most common type of spur encountered in the frequency conversion is an image, i.e., the product of converting an adjacent signal at a lower frequency to a mixing product which interferes with the immediate frequency signal produced by the signal of interest.

A common technique used to reject spurs or images is to use a filter that prevents the radio frequency signal adjacent the radio frequency of interest from entering the frequency conversion circuitry. Filters, however, are large, costly, and may consume an undesirable amount of current from the battery. Another approach to the image problem is to use special phasing techniques which cancel out the image. These image reject mixers, while effective in rejecting the image, also suffer from high current consumption which reduces the battery life. It is therefore desirable to provide an image rejection mixer which can operate at low current, thereby saving battery power, while preserving the lineary and noise performance of the frequency conversion circuit.

SUMMARY OF THE INVENTION

In accordance with the invention, first and second doubly balanced mixers are provided which convert a common radio frequency signal to an intermediate frequency signal. The first doubly balanced mixer produces a pair of differential currents which represent the sum and difference of the local oscillator signal and a radio frequency signal. A second doubly balanced mixer frequency converts the same radio frequency signal producing a pair of differential currents representing the sum and difference of the radio frequency signal, using a ninety degree phase shifted version of the local oscillator signal. The first and second pairs of differential signals are combined in a quadrature combining circuit to produce a differential intermediate frequency signal substantially free of signal images.

DESCRIPTION OF THE PREFERRED EMBODIMENT

Figure 1A:
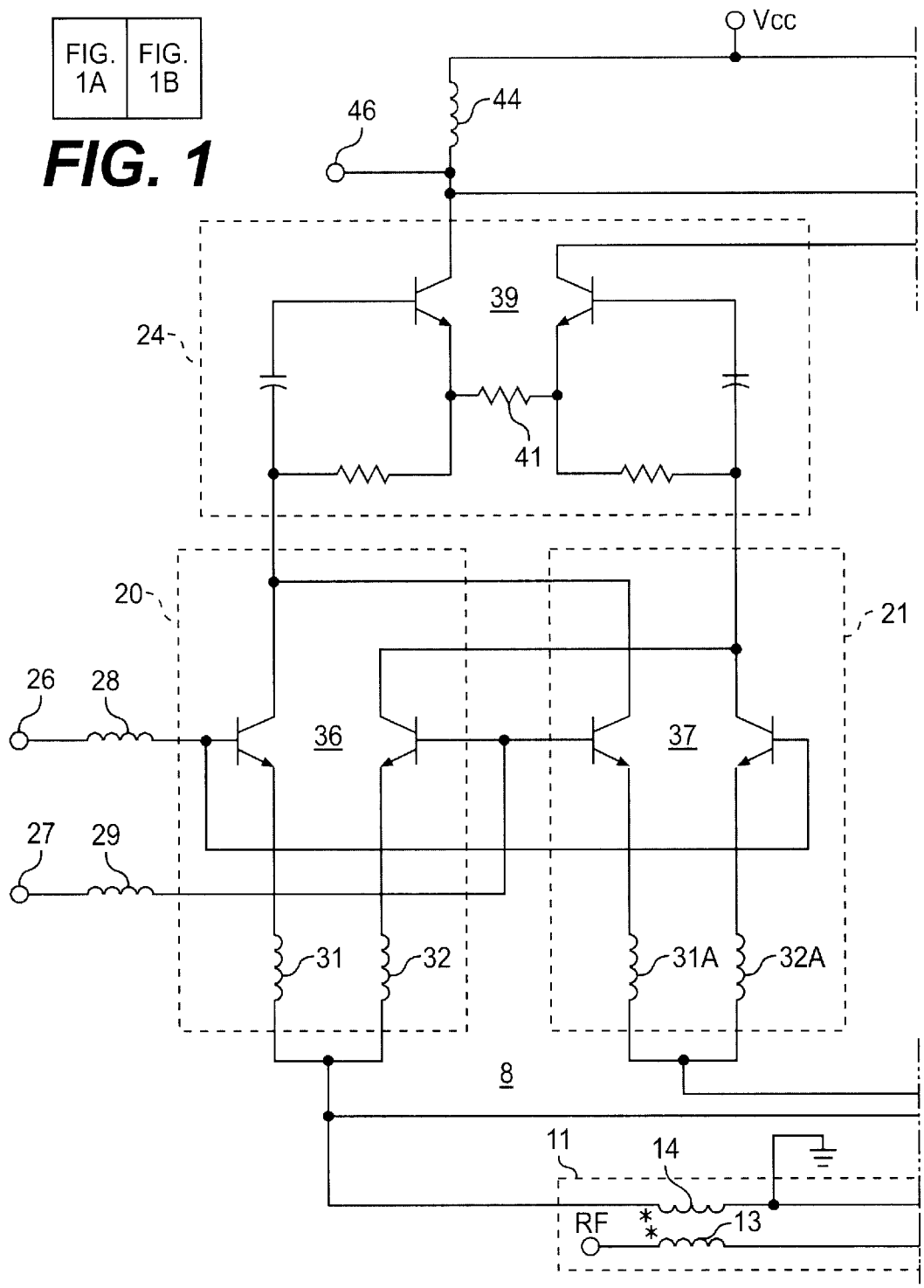
FIG. 1 is a schematic drawing of an image reject mixer in accordance with a preferred embodiment of the invention.
Figure 1B:
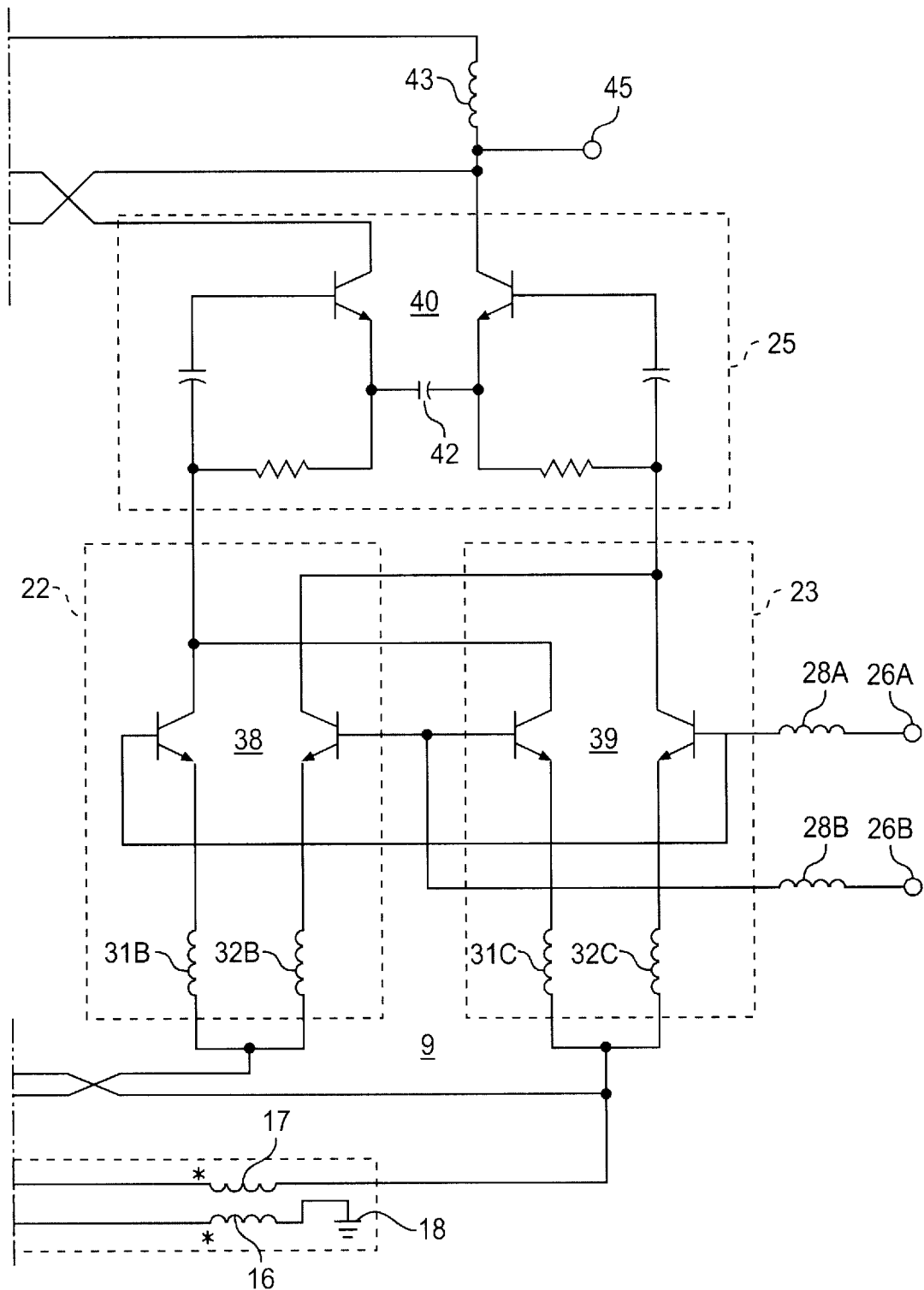

Referring now to FIG. 1, an image reject mixer in accordance with a preferred embodiment of the invention is shown. The image reject mixer includes first and second doubly balanced mixers 8, 9. The components of doubly balanced mixer 9 are identical to the components of doubly balanced mixer 8 and have the same reference numeral, but are differentiated by the letters A, B and C. The first doubly balance mixer includes a first differential amplifier 20, having collectors of a transistor pair 36 cross coupled to collectors of transistor pair 37 of a substantially identical differential amplifier 21. The emitters of each of the differential transistor pair 36, 37 are connected to inductances 31 and 32, and 31a and 32b. Each of the differential transistor pairs 36, 37 produce first and second differential currents. The differential currents are the product of a radio frequency signal applied to terminal 10, and a local oscillator signal applied to terminals 26, 27. Local oscillator signals applied to doubly balanced mixers 8, 9 have the same frequency, derived from the same frequency source, such as a voltage control oscillator, but are in phase quadrature. The local oscillator signals are applied through inductances 28 and 29, which provide a matching impedance between the base circuit of transistor pairs 36 and 37, and the source of local oscillator signals for terminals 26 and 27.

The radio frequency input signal is applied to terminal 10. A balun transformer 1, having primary windings 13 and 16, produces on secondary windings 14 and 17, two in phase radio frequency signals which are fed to each of the doubly balanced mixers 8, 9 through inductances 31 and 31, and 31A and 32B to provide a differential signal to the emitters of transistor pairs 36 and 37. The radio frequency signal applied to terminal 10 is mixed with a pair of local oscillator signals producing differential currents from transistor pairs 37 and 36 which art supplied to the combining circuit 24.

The second doubly balance mixer 9 is constructed identically to the first doubly balance mixer 8. Two pairs of bipolar transistors 38 and 39 have emitters connected to inductances 31b and 32b, and 31c and 32c, which are substantially the same as inductances 31 and 32. The radio frequency signal from balun transformer 11 is applied through the aforesaid inductances to the emitters of each transistor pair 38 and 39. The local oscillator quadrature signal is applied to the bases of each pair of transistors 38 and 39. In this way, differential currents are also produced from transistor pairs 38 and 39 constituting the mixed radio frequency and local oscillator signals.

The resulting mixing signals are combined in first and second quadrature combining circuits 24 and 25 serially connected with the doubly balance mixer circuits 8, 9. The serial connection results in a lower current requirement for the battery power supply Vcc conserving batter power.

Each of the quadrature combining circuits 24 and 25 include a pair of differential transistors 39 and 40. Transistor pairs 39 and 40 receive the respective differential signals from the first balanced mixer 8, and the second balanced mixer 9. A phase shift is introduced between the signals produced by transistor pairs 39 and 40, so that the phase difference between the respective pairs of differential input signals Is shifted 90°. The respective phase shift is obtained by providing emitter degeneration for transistor pair 39 using a resistor 41, and by using a capacitor 42 for differential transistor pair 40, The feedback provided by each of these components phase shifts the output signals an additional 90° phase shift, so that there is cancellation of unwanted spur and image components produced from the first and second doubly balanced mixer circuits 8, 9. The advantage of using feedback, rather than passive phase shift elements, is to avoid signal losses which would normally occur in such devices, and which would necessitate an increased burden on the battery power supply Vcc.

The differential currents produced by each of the transistor pairs 39 and 40, are cross-coupled to form differential signals across load inductances 33, 34 on output terminals 45 and 46. Load inductances 43 and 44 are utilized, rather than a passive resistive element which would add to the power dissipation and current drain on the battery power supply.

Thus, there has been described with respect to one embodiment of the invention, an image reject mixer which conserves current for low power battery operated radio telecommunication devices. Significant savings in current are provided, while preserving the linearity and noise performance for the image rejection mixer.

Thus, there hasp described with respect to one embodiment of the invention an image reject mixer which is particularly useful in the portable radio and telecommunications art.

What is claimed is:

1. An image reject mixer comprising:

first doubly balanced mixer receiving a local oscillator signal and an radio frequency signal, said doubly balanced mixer providing first and second differential currents which represent the sum and difference of said local oscillator signal and said radio frequency signal;

a second doubly balanced mixer receiving said local oscillator signal which has been phase shifted, and said radio frequency signal said second doubly balanced mixer producing first and second differential currents which represent the sum and difference of said phase shifted local oscillator signal and said radio frequency signal;

each of said doubly balanced mixers comprising first and second pairs of bipolar transistors, said first and second pairs of transistors receiving said local oscillator signal between respective base connections, said first pair of transistors having emitters connected through impedance elements to one side of a source of radio frequency signals, said second pair of transistors having emitters connected through impedance elements to a second side of said source of radio frequency signals, and collectors of said transistors of said first pair of transistors being connected to collectors of transistors of said second pair of transistors to provide said first and second differential currents; and a quadrature combiner circuit for combining said first and second doubly balanced mixer first and second differential currents in a substantially quadrature relationship, and producing a pair of differential I.F. signals which are substantially free of signal images.

2. The image reject mixer according to claim 1 wherein said quadrature combiner circuit comprises: first and second pairs of transistors, each pair of transistors having emitter connections connected to collectors of said first and second doubly balanced mixers, through first and second resistor elements, and having base connections capacitively coupled to connected collectors; and first and second phase shift impedances connected between respective emitters of each pair of said transistors, said impedances providing a feedback signal for shifting the phase of currents produced by collectors of said pairs of transistors so they are substantially ninety degrees shifted with respect to each other; and a first collector impedance connected to collectors of a first transistor of said first pair, and a first transistor of said second pair forming a first output terminal, and a second collector impedance connected to collectors of a second transistor of said first pair and a second transistor of said second pair of transistors, forming a second output terminal which produces with respect to said first output terminal said differential I.F. signals.

3. The image reject mixer according to claim 2 wherein said collector impedances are inductors connected to a source of voltage potential.

4. The image rejection mixer according to claim 2 wherein said first and second phase shift impedance elements comprise a resistor and capacitor which produce a net phase shift of 90 degrees between signals produced by said first and second pairs of transistors of said quadrature combiner circuit.

5. The image rejection mixer according to claim 1 further comprising:

a transformer having first and second secondary windings connected serially with each other, and serially connecting said emitter resistance elements of said first pair of transistors of said first and second doubly balanced mixers with said second pair of transistors of said first and second doubly balanced mixers, and having a primary winding connected to the source of radio frequency signals.

6. The image reject mixer according to claim 1 further comprising:

an impedance matching element for coupling said local oscillator signal to said base connections for each transistor of said first and second pairs of transistors of said first and second doubly balanced mixers.

7. The image rejection waxer according to claim 1 wherein said source of radio frequency signals includes a transformer which supplies said radio frequency signal to said doubly balanced mixers.

8. An image reject mixer comprising:

first and second doubly balanced mixers which produce first and second differential currents, said differential currents being phase shifted at substantially ninety degrees from each other, representing the difference between a local oscillator signal and an radio frequency signal; and a quadrature combiner which combines said first and second differential currents in a substantially quadrature relationship to produce an output differential current, comprising:

first and second transistors having base connections connected to one end of first and second capacitors; and emitter connections connected through fist and second emitter resistors to a remaining end of a respective of said first and second capacitors to form a first input for said first differential current;

third and fourth transistors having base connections connected at one end to third and fourth capacitors, a collector of said third transistor being connected to a collector of said first transistor, and a collector of said fourth transistor being connected to a collector of said second transistor, said third and fourth transistors having emitter connections connected through third and fourth emitter resistors to a remaining end of respective of said third and fourth capacitors to form a second input for said second differential current;

a first phase shift impedance connected between said first and second transistors emitter connections;

a second phase shift impedance connected between said third and fourth transistors emitter connections;

a first load impedance connected to said collector of said first transistor and to a source of voltage potential;

a second load impedance connected to said collector of said fourth transistor and to said source of voltage potential;

said first transistor collector and said fourth transistor collector producing said output differential current.

9. The image rejector mixer according to claim 7 wherein said first and second load impedances are inductors.

10. The image reject mixer according to claim 8 wherein said first phase shift impedance is a resistor and said second phase shift impedance is a capacitor which shifts said first and second differential currents into a substantially quadrature, phase relationship.

* * * * *